(12) United States Patent
Nagasaka et al.

(10) Patent No.: US 7,466,392 B2
(45) Date of Patent: Dec. 16, 2008

(54) EXPOSURE APPARATUS, EXPOSURE METHOD, AND METHOD FOR PRODUCING DEVICE

(75) Inventors: Hiroyuki Nagasaka, Kumagaya (JP); Nobutaka Magome, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/583,946

(22) Filed: Oct. 20, 2006

(65) Prior Publication Data

US 2007/0035710 A1 Feb. 15, 2007

Related U.S. Application Data

(60) Division of application No. 11/147,373, filed on Jun. 8, 2005, which is a continuation of application No. PCT/JP03/15735, filed on Dec. 9, 2003.

(30) Foreign Application Priority Data

Dec. 10, 2002 (JP) ............... 2002-357931

(51) Int. Cl.
*G03B 27/42* (2006.01)
*G03B 27/52* (2006.01)

(52) U.S. Cl. .......................... 355/53; 355/30
(58) Field of Classification Search ............ 355/53, 355/55, 77; 250/548; 430/327; 427/508
See application file for complete search history.

(56) References Cited

U.S. PATENT DOCUMENTS

| | | | |
|---|---|---|---|
| 4,346,164 A | 8/1982 | Tabarelli et al. |
| 4,480,910 A | 11/1984 | Takanashi et al. |
| 5,610,683 A | 3/1997 | Takahashi |
| 5,715,039 A | 2/1998 | Fukuda et al. |
| 5,825,043 A | 10/1998 | Suwa |
| 6,633,365 B2 | 10/2003 | Suenaga |
| 6,992,750 B2 | 1/2006 | Kawashima et al. |
| 2002/0163629 A1 | 11/2002 | Switkes et al. |
| 2003/0030916 A1 | 2/2003 | Suenaga |
| 2003/0174408 A1 | 9/2003 | Rostalski et al. |

(Continued)

FOREIGN PATENT DOCUMENTS

DE 221 563 A1 4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner*—Peter B Kim
(74) *Attorney, Agent, or Firm*—Oliff & Berridge, PLC

(57) ABSTRACT

A device manufacturing method includes the steps of providing an immersion liquid between a substrate and at least a portion of a projection system of a lithographic projection apparatus, wherein a non-radiation sensitive material is carried by the substrate, the non-radiation sensitive material being at least partially transparent to radiation and being of a different material than the immersion liquid, the non-radiation sensitive material being provided over at least a part of a radiation sensitive layer of the substrate; and projecting a patterned beam of radiation, through the immersion liquid, onto a target portion of the substrate using the projection system.

20 Claims, 9 Drawing Sheets

U.S. PATENT DOCUMENTS

| | | |
|---|---|---|
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0002004 A1 | 1/2005 | Kolesynchenko et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0141098 A1 | 6/2005 | Schuster |
| 2005/0175940 A1 | 8/2005 | Dierichs |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0225738 A1 | 10/2005 | Shirai |
| 2005/0233081 A1 | 10/2005 | Tokita |

FOREIGN PATENT DOCUMENTS

| | | |
|---|---|---|
| DE | 224 448 A1 | 7/1985 |
| EP | 0 605 103 A1 | 7/1994 |
| EP | 0 834 773 A2 | 4/1998 |
| EP | 1 477 856 A1 | 11/2004 |
| EP | 1 491 956 A1 | 12/2004 |
| JP | A-57-153433 | 9/1982 |
| JP | A-58-202448 | 11/1983 |
| JP | A-59-19912 | 2/1984 |
| JP | A 62-65326 | 3/1987 |
| JP | A 63-157419 | 6/1988 |
| JP | A-4-305915 | 10/1992 |
| JP | A-4-305917 | 10/1992 |
| JP | A-5-62877 | 3/1993 |
| JP | A 5-304072 | 11/1993 |
| JP | A 6-124873 | 5/1994 |
| JP | A 6-168866 | 6/1994 |
| JP | A 7-220990 | 8/1995 |
| JP | A-8-316125 | 11/1996 |
| JP | A 10-154659 | 6/1998 |
| JP | A 10-255319 | 9/1998 |
| JP | A 10-303114 | 11/1998 |
| JP | A 10-340846 | 12/1998 |
| JP | A 11-176727 | 7/1999 |
| JP | A 2000-58436 | 2/2000 |
| WO | WO99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, "Nikon F2 Exposure Tool", Soichi Owa et al., Sep. 4, 2003, 3rd 157nm symposium, 25 pages.

Nikon Corporation, "Immersion lithography; its potential performance and issues", Soichi Owa et al., Proceedings of SPIE, Optical Microlithography XVI, vol. 5040, Jun. 2003, pp. 724-733.

Nikon Corporation, "Potential performance and feasibility of immersion lithography", Soichi Owa et al., NGL Workshop, Jul. 10, 2003, 33 pages.

MOVEMENT

MOVEMENT

EXPOSURE APPARATUS, EXPOSURE METHOD, AND METHOD FOR PRODUCING DEVICE

CROSS-REFERENCE

This is a Division of application Ser. No. 11/147,373 filed Jun. 8, 2005, which in turn is a Continuation of International Application No. PCT/JP03/015735 filed on Dec. 9, 2003 and that claims the conventional priority of Japanese patent Application No. 2002-357931 filed on Dec. 10, 2002. The disclosures of these applications are incorporated herein by reference in their entireties.

BACKGROUND OF THE INVENTION

1. Field of the Invention

The present invention relates to an exposure apparatus and an exposure method for performing the exposure with an image of a pattern projected by a projection optical system in a state in which at least a part of a space between the projection optical system and a substrate is filled with a liquid. The present invention also relates to a method for producing a device.

2. Description of the Related Art

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased inn order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times.

When the exposure is performed while making the liquid to flow through the space between the projection optical system and the substrate, or when the exposure is performed while moving the substrate with respect to the projection optical system in a state in which the space between the projection optical system and the substrate is filled with the liquid, then there is such a possibility that the liquid may be exfoliated from the projection optical system and/or the substrate. An inconvenience arises such that the pattern image, which is to be transferred to the substrate, is deteriorated. In other cases, the pattern image is deteriorated as well when any turbulence appears in the liquid flow when the exposure is performed while making the liquid to flow through the space between the projection optical system and the substrate.

SUMMARY OF THE INVENTION

The present invention has been made taking the foregoing circumstances into consideration, an object of which is to provide an exposure apparatus, an exposure method, and a method for producing a device, in which a pattern can be transferred accurately by arranging a liquid in a desired state when an exposure process is performed while filling a space between a projection optical system and a substrate with the liquid. It is noted that parenthesized numerals or symbols affixed to respective elements merely exemplify the elements by way of example, with which it is not intended to limit the respective elements.

In order to achieve the object as described above, the present invention adopts the following constructions.

According to a first aspect of the present invention, there is provided an exposure apparatus which exposes a substrate by transferring an image of a pattern through a liquid onto the substrate, the exposure apparatus comprising:

a projection optical system which projects the image of the pattern onto the substrate, wherein:

a portion of the projection optical system, which makes contact with the liquid, is surface-treated to adjust affinity for the liquid.

In the exposure apparatus of the present invention, the surface treatment is applied to the portion of the projection optical system (hereinafter appropriately referred to as "liquid contact portion") which makes contact with the liquid in order to adjust the affinity for the liquid. Therefore, the liquid is maintained in a desired state between the projection optical system and the substrate. For example, if the affinity of the liquid contact portion for the liquid is too low, any phenomenon, in which any harmful influence is exerted on the liquid immersion exposure, arises, for example, such that the liquid is exfoliated from the contact portion, and/or any bubble is generated. On the other hand, if the affinity of the liquid contact portion for the liquid is too high, any inconvenience arises in some cases, for example, such that the liquid is spread while causing excessive wetting with respect to the contact portion and the liquid outflows from the space between the projection optical system and the substrate. On the contrary, in the case of the exposure apparatus of the present invention, the affinity is adjusted with respect to the liquid disposed at the liquid contact portion of the projection optical system. Therefore, the liquid immersion state is reliably maintained between the substrate and the projection optical system even in the case of the full field exposure in which the substrate stands still with respect to the exposure light beam during the exposure as well as in the case of the scanning type exposure apparatus in which the substrate is moved by a movable stage during the exposure.

According to a second aspect of the present invention, there is provided an exposure apparatus which exposes a substrate by transferring an image of a pattern through a liquid onto the substrate, the exposure apparatus comprising:

a projection optical system which projects the image of the pattern onto the substrate, wherein:

the projection optical system has a first surface area which includes a surface of an optical element disposed at a tip of the projection optical system, and a second surface area which is disposed around the first surface area; and affinity of the first surface area for the liquid is higher than affinity of the second surface area for the liquid.

According to the present invention, the affinity for the liquid of the first surface area including the optical element disposed at the tip of the projection optical system is made higher than that of the second surface area disposed therearound. Accordingly, the liquid is stably arranged on the optical path for the exposure light beam owing to the first surface area. Further, the liquid is not spread with the wetting to the surroundings owing to the second surface area, and thus does not outflow to the outside. Therefore, the liquid can be stably arranged on the optical path for the exposure light beam even in the case of the full field exposure in which the substrate stands still with respect to the exposure light beam during the exposure as well as in the case of the scanning type exposure in which the substrate is moved with respect to the exposure light beam during the exposure.

According to a third aspect of the present invention, there is provided an exposure apparatus which exposes a substrate by illuminating a pattern with an exposure beam and transferring an image of the pattern through a liquid onto the substrate, the exposure apparatus comprising:

a projection optical system which projects the image of the pattern onto the substrate; and a liquid immersion unit which fills, with the liquid, at least a part of a space between the projection optical system and the substrate, wherein:

a conditional expression $(v \cdot d \cdot \rho)/\mu \leq 2{,}000$ is satisfied provided that d represents a thickness of the liquid, v represents a velocity of a flow of the liquid between the projection optical system and the substrate, $\rho$ represents a density of the liquid, and $\mu$ represents a coefficient of viscosity of the liquid.

According to the present invention, the condition, under which the liquid is maintained in at least the part of the space between the projection optical system and the substrate, is set so that the conditional expression described above is satisfied. Accordingly, no turbulence arises in the liquid. Therefore, it is possible to suppress any inconvenience which would be otherwise caused, for example, such that the pattern image to be projected onto the substrate is deteriorated due to the turbulence of the liquid.

According to a fourth aspect of the present invention, there is provided an exposure apparatus which exposes a substrate by illuminating a pattern of a mask with an exposure beam and transferring an image of the pattern through a liquid onto the substrate, the exposure apparatus comprising:

a projection optical system which projects the image of the pattern onto the substrate; and a liquid immersion unit which fills, with the liquid, at least a part of a space between the projection optical system and the substrate, wherein:

the liquid flows as a laminar flow in parallel to a scanning direction of the substrate.

According to the present invention, the liquid immersion state is controlled by various methods, and thus the liquid flows while forming the laminar flow in parallel to the scanning direction of the substrate during the exposure. Therefore, it is possible to avoid the deterioration of the pattern image to be projected onto the substrate. Further, no unnecessary vibration is generated, for example, in the projection optical system which makes contact with the liquid as well as in the wafer and the substrate stage which holds the wafer. The flow of the liquid can be made into the laminar flow, for example, by controlling the amount of supply (recovery) of the liquid by the liquid immersion unit, adjusting the structure of the liquid supply nozzle of the liquid immersion unit, and/or adjusting the velocity when the substrate is moved during the exposure.

According to a fifth aspect of the present invention, there is provided an exposure apparatus which exposes a substrate by illuminating a pattern with an exposure beam and transferring an image of the pattern through a liquid onto the substrate, the exposure apparatus comprising:

a projection optical system which projects the image of the pattern onto the substrate;

a liquid immersion unit which supplies the liquid onto only the substrate; and a control unit which controls the liquid immersion unit, wherein:

the control unit controls the liquid immersion unit so that the supply of the liquid is stopped during the exposure of the substrate.

According to the present invention, the liquid immersion unit is controlled such that the liquid is not supplied during the exposure for the substrate. Accordingly, the photosensitive material, which has been applied onto the substrate, is not damaged. It is possible to avoid the deterioration of the pattern to be formed on the substrate. Further, the positional relationship between the projection optical system and the substrate can be stably maintained in a desired state.

According to a sixth aspect of the present invention, there is provided an exposure method for exposing a substrate by projecting an image of a pattern onto the substrate by using a projection optical system, the exposure method comprising:

applying a surface treatment to a surface of the substrate before the exposure in order to adjust affinity for the liquid;

filling at least a part of a space between the projection optical system and the substrate with the liquid; and projecting the image of the pattern onto the substrate through the liquid.

According to the present invention, the surface treatment is applied to the surface of the substrate depending on the affinity for the liquid before performing the liquid immersion exposure. Accordingly, the liquid can be maintained on the substrate in a state preferable for the liquid immersion exposure. For example, if the affinity for the liquid is too low, any inconvenience arises, for example, such that the liquid is exfoliated from the surface of the substrate, and/or any bubble is generated. On the other hand, if the affinity for the liquid is too high, any inconvenience arises in some cases, for example, such that the liquid is spread excessively while causing wetting on the substrate. On the contrary, when the appropriate surface treatment is applied to the substrate surface in consideration of the affinity for the liquid as in the exposure method of the present invention, then the liquid can be maintained in a desired state on the substrate, and it is possible to appropriately perform the recovery and the removal of the liquid on the substrate.

DESCRIPTION OF THE PREFERRED EMBODIMENTS OF THE INVENTION

Figure 1:
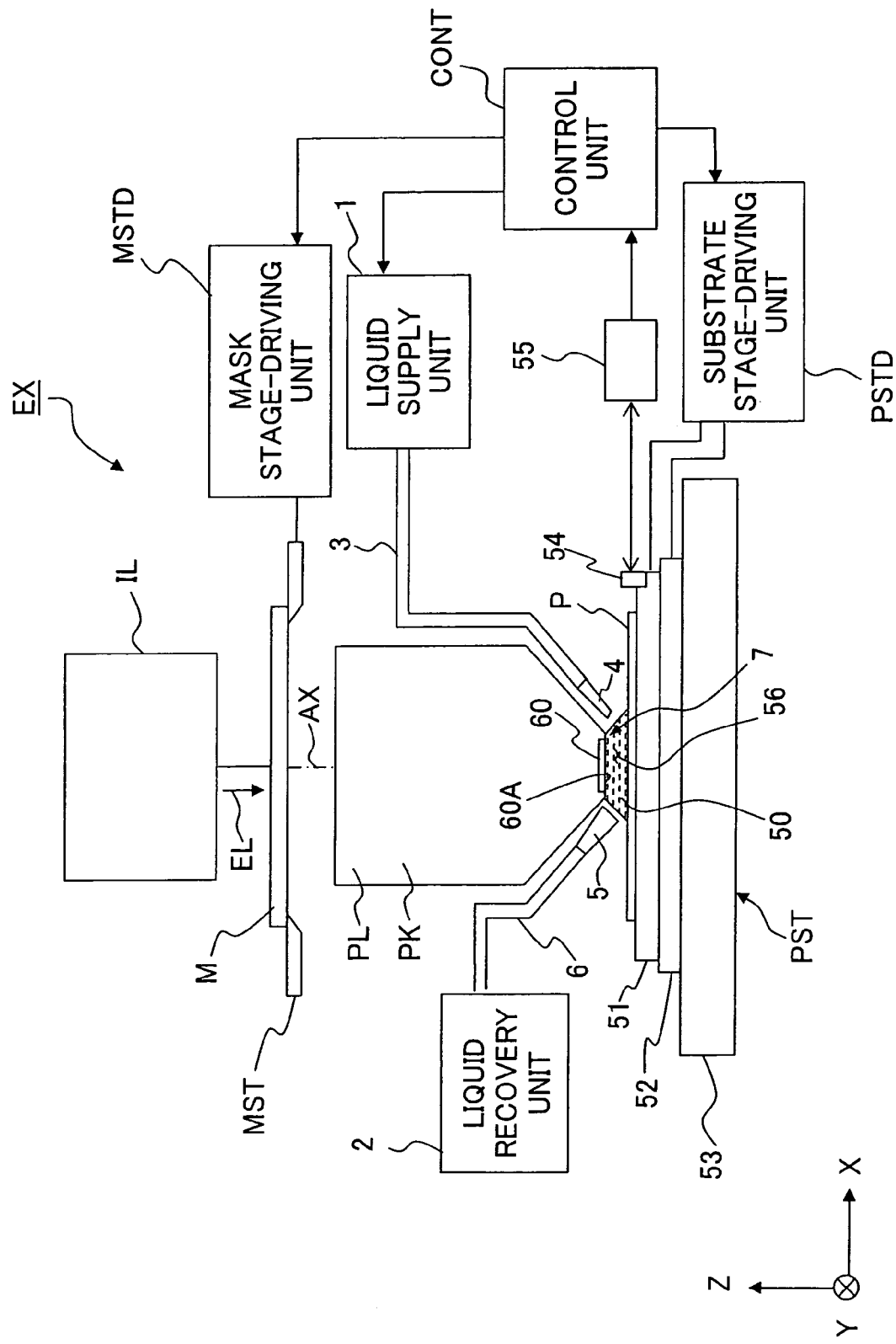
FIG. 1 shows a schematic arrangement illustrating an embodiment of the exposure apparatus of the present invention.

An explanation will be made below about the exposure apparatus and the method for producing the device according to the present invention with reference to the drawings. However, the present invention is not limited thereto. FIG. 1 shows a schematic arrangement illustrating an embodiment of the exposure apparatus of the present invention.

With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the Y axis direction. The directions about the X axis, the Y axis, and the Z axis are designated as θX, θY, and θZ directions respectively. The term "substrate" referred to herein includes those obtained by applying a resist on a semiconductor wafer, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. The position in the two-dimensional direction and the angle of rotation of the mask M on the mask stage MST are measured in real-time by a laser interferometer. The result of the measurement is outputted to the control unit CONT. The control unit CONT drives the mask stage-driving unit MSTD on the basis of the result of the measurement obtained by the laser interferometer to thereby position the mask M supported on the mask stage MST.

The projection optical system PL projects the pattern on the mask M onto the substrate P at a predetermined projection magnification β to perform the exposure. The projection optical system PL includes a plurality of optical elements (lenses). The optical elements are supported by a barrel PK formed of a metal member, for example, stainless steel (SUS 403). In this embodiment, the projection optical system PL is a reduction system having the projection magnification β which is, for example, ¼ or ⅕. The projection optical system PL may be any one of the 1× magnification system and the magnifying system. The plane parallel plate (optical element) 60, which is formed of a glass member such as quartz and calcium fluoride (fluorite), is provided at the tip section 7 on the side of the substrate P of the projection optical system PL of this embodiment. The optical element 60 is provided detachably (exchangeably) with respect to the barrel PK. The tip section 7 of the projection optical system PL includes the optical element 60 and a part of the barrel (holding member) PK for holding the same.

The substrate stage PST supports the substrate P. The substrate stage PST includes a Z stage 51 which holds the substrate P by the aid of a substrate holder, an XY stage 52 which supports the Z stage 51, and a base 53 which supports the XY stage 52. The substrate stage PST is driven by a substrate stage-driving unit PSTD such as a linear motor. The substrate stage-driving unit PSTD is controlled by the control unit CONT. When the Z stage 51 is driven, the substrate P, which is held on the Z stage 51, is subjected to the control of the position (focus position) in the Z axis direction and the positions in the θX and θY directions. When the XY stage 52 is driven, the substrate P is subjected to the control of the position in the XY directions (position in the directions substantially parallel to the image plane of the projection optical system PL). That is, the Z stage 51 controls the focus position and the angle of inclination of the substrate P so that the surface of the substrate P is adjusted to match the image plane of the projection optical system PL in the auto-focus manner and the auto-leveling manner. The XY stage 52 positions the substrate P in the X axis direction and the Y axis direction. It goes without saying that the Z stage and the XY stage may be provided as an integrated body.

A movement mirror 54, which is movable together with the substrate stage PST with respect to the projection optical system PL, is provided on the substrate stage PST (Z stage 51). A laser interferometer 55 is provided at a position opposed to the movement mirror 54. The angle of rotation and the position in the two-dimensional direction of the substrate P on the substrate stage PST are measured in real-time by the laser interferometer 55. The result of the measurement is outputted to the control unit CONT. The control unit CONT drives the substrate stage-driving unit PSTD on the basis of the result of the measurement of the laser interferometer 55 to thereby position the substrate P supported on the substrate stage PST.

In this embodiment, the liquid immersion method is applied in order that the resolution is improved by substantially shortening the exposure wavelength and the depth of focus is substantially widened. Therefore, the space between the surface of the substrate P and the tip section 7 of the projection optical system PL is filled with the predetermined liquid 50 at least during the period in which the image of the pattern on the mask M is transferred onto the substrate P. As described above, the optical element 60 and the part of the barrel PK are arranged at the tip section 7 of the projection optical system PL. The liquid 50 makes contact with the optical element (glass member) 60 and the barrel (metal member) PK. In this embodiment, pure water is used for the liquid 50. The exposure light beam EL, which is not limited to only the ArF excimer laser beam, can be transmitted through pure water, even when the exposure light beam EL is, for example, the emission line (g-ray, h-ray, i-ray) in the ultraviolet region radiated, for example, from a mercury lamp or the far ultraviolet light beam (DUV light beam) such as the KrF excimer laser beam (wavelength: 248 nm).

The exposure apparatus EX includes a liquid supply unit (liquid immersion unit, supply unit) 1 which supplies the predetermined liquid 50 to a space 56 between the substrate P and the tip section 7 of the projection optical system PL, and a liquid recovery unit (liquid immersion unit, recovery unit) 2 which recovers the liquid 50 from the space 56. The liquid supply unit 1 is provided to allow the liquid 50 to flow in parallel to the scanning direction of the substrate P to at least a part of the space between the projection optical system PL and the substrate P. The liquid supply unit 1 includes, for example, a tank for accommodating the liquid 50, and a pressurizing pump. One end of a supply tube 3 is connected to the liquid supply unit 1. Supply nozzles 4 are connected to the other end of the supply tube 3. The liquid supply unit 1 supplies the liquid 50 to the space 56 through the supply tube 3 and the supply nozzles 4.

The liquid recovery unit 2 includes, for example, a suction pump, and a tank for accommodating the recovered liquid 50. One end of a recovery tube 6 is connected to the liquid recovery unit 2. Recovery nozzles 5 are connected to the other end of the recovery tube 6. The liquid recovery unit 2 recovers the liquid 50 from the space 56 through the recovery nozzles 5 and the recovery tube 6. When the space 56 is filled with the liquid 50, then the control unit CONT drives the liquid supply unit 1 so that the liquid 50, which is in a predetermined amount per unit time, is supplied to the space 56 through the supply tube 3 and the supply nozzles 4, and the control unit CONT drives the liquid recovery unit 2 so that the liquid 50, which is in a predetermined amount per unit time, is recovered from the space 56 through the recovery nozzles 5 and the recovery tube 6. Accordingly, the liquid 50 is retained in the space 56 between the substrate P and the tip section 7 of the projection optical system PL.

During the scanning exposure, a pattern image of a part of the mask M is projected onto the rectangular projection area disposed just under an end surface 60A. The mask M is moved at the velocity V in the −X direction (or in the +X direction) with respect to the projection optical system PL, in synchronization with which the substrate P is moved at the velocity $\beta \cdot V$ ($\beta$ is the projection magnification) in the +X direction (or in the −X direction) by the aid of the XY stage 52. After the completion of the exposure for one shot area, the next shot area is moved to the scanning start position in accordance with the stepping of the substrate P. The exposure process is successively performed thereafter for each of the shot areas in the step-and-scan manner. This embodiment is designed so that the liquid 50 is allowed to flow in the same direction as the movement direction of the substrate in parallel to the movement direction of the substrate P.

Figure 2:
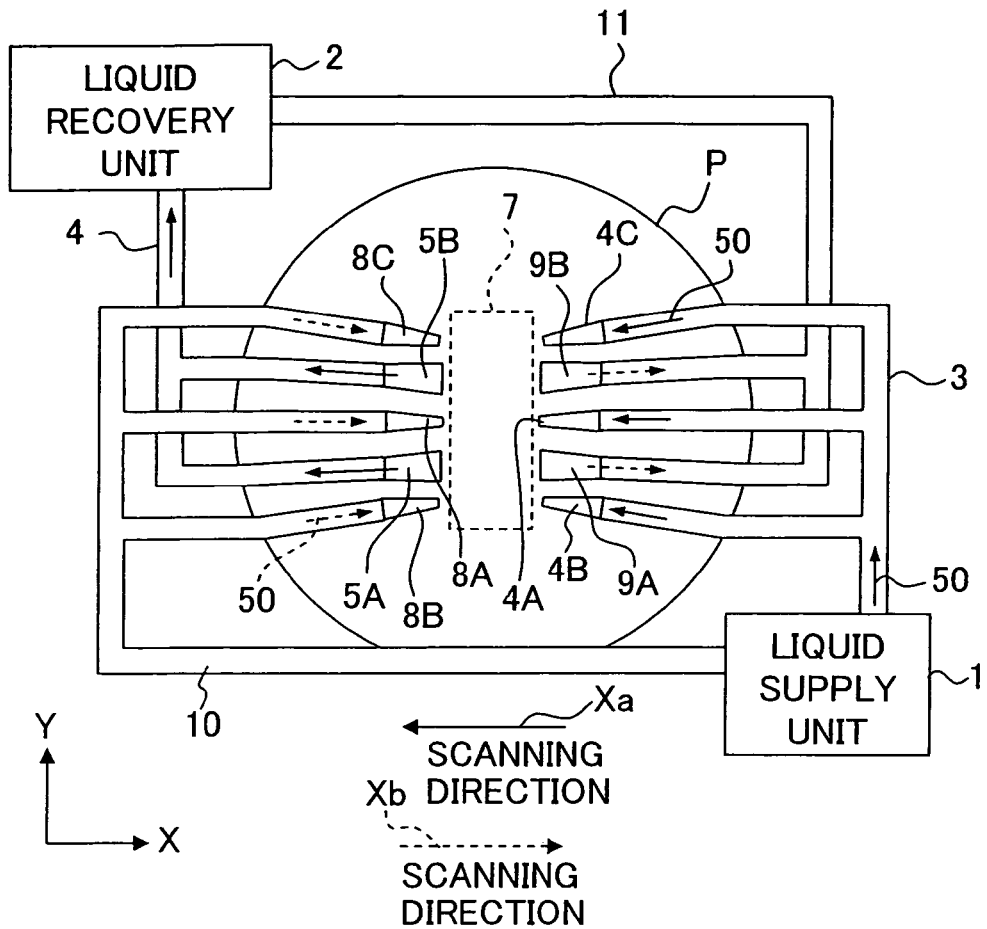
FIG. 2 shows an exemplary arrangement of supply nozzles and recovery nozzles.

FIG. 2 shows the positional relationship among the tip section 7 of the projection optical system PL, the supply nozzles 4 (4A to 4C) for supplying the liquid 50 in the X axis direction, and the recovery nozzles 5 (5(a), 5(b)) for recovering the liquid 50. In FIG. 2, the tip section 7 (end surface 60A of the optical element 60) has a rectangular shape which is long in the Y axis direction. The three supply nozzles 4A to 4C are arranged on the side in the +X direction, and the two recovery nozzles 5(a), 5(b) are arranged on the side in the −X direction so that the tip section 7 of the projection optical system PL is interposed thereby in the X axis direction. The supply nozzles 4A to 4C are connected to the liquid supply unit 1 through the supply tube 3, and the recovery nozzles 5(a), 5(b) are connected to the liquid recovery unit 2 through the recovery tube 4. Further, the supply nozzles 8(a) to 8C and the recovery nozzles 9A, 9B are arranged at positions obtained by rotating, by substantially 180°, the positions of the supply nozzles 4A to 4C and the recovery nozzles 5(a), 5(b) about the center of the tip section 7. The supply nozzles 4A to 4C and the recovery nozzles 9A, 9B are alternately arranged in the Y axis direction. The supply nozzles 8(a) to 8C and the recovery nozzles 5(a), 5(b) are alternately arranged in the Y axis direction. The supply nozzles 8(a) to 8C are connected to the liquid supply unit 1 through the supply tube 10. The recovery nozzles 9A, 9B are connected to the liquid recovery unit 2 through the recovery tube 11. The liquid is supplied from the nozzles so that no gas portion is formed between the projection optical system PL and the substrate P.

Figure 3:
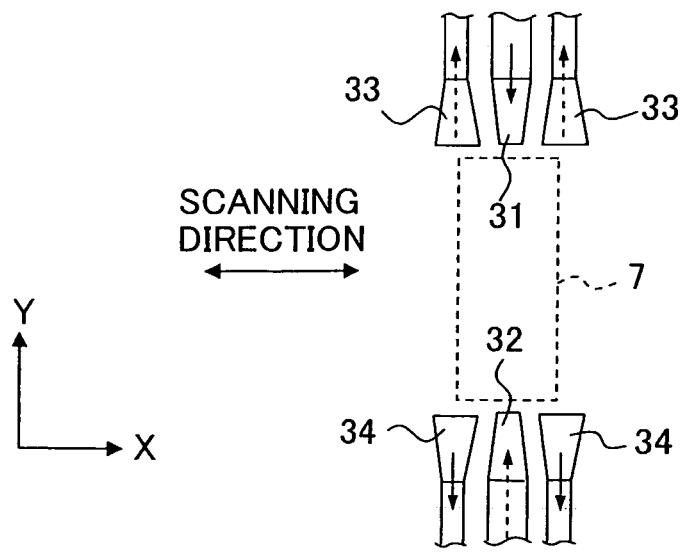
FIG. 3 shows an exemplary arrangement of supply nozzles and recovery nozzles.

As shown in FIG. 3, the supply nozzles 31, 32 and the recovery nozzles 33, 34 may be also provided on the both sides in the Y direction with the tip section 7 intervening therebetween. The supply nozzles and the recovery nozzles can be used to stably supply the liquid 50 to the space between the projection optical system PL and the substrate P even during the movement of the substrate P in the non-scanning direction (Y axis direction) when the stepping movement is performed.

The shape of the nozzle is not specifically limited. For example, two pairs of the nozzles may be used to supply or recover the liquid 50 for the long side of the tip section 7. In this arrangement, the supply nozzles and the recovery nozzles may be arranged while being aligned vertically in order that the liquid 50 can be supplied and recovered in any one of the directions of the +X direction and the −X direction.

Figure 4:
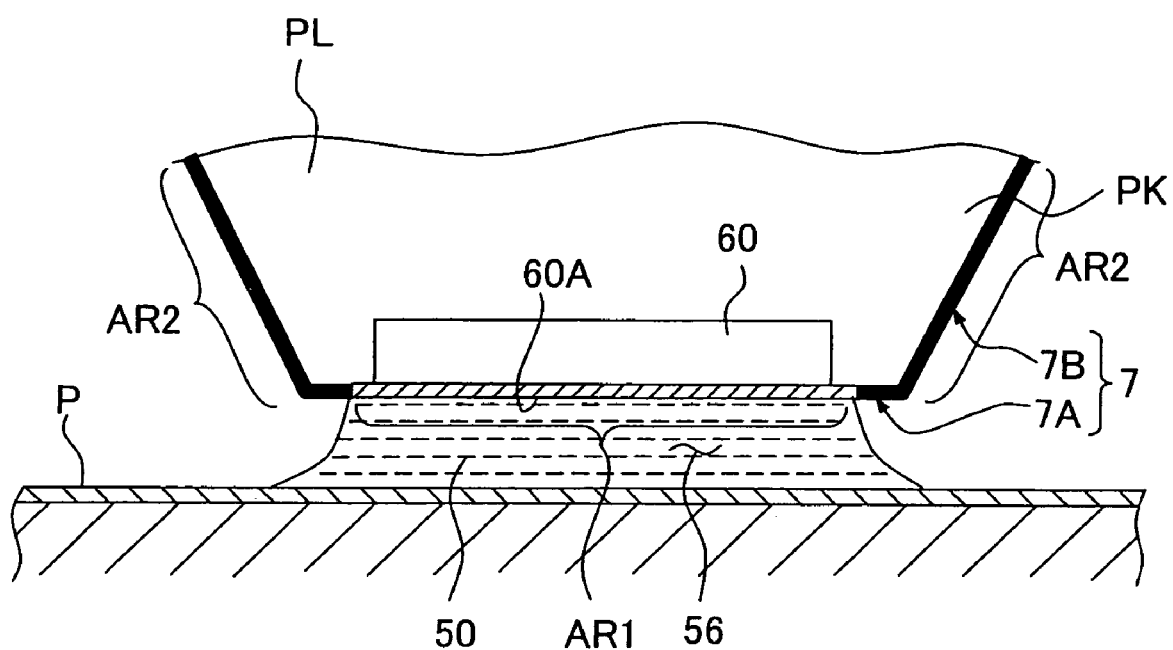
FIG. 4 schematically illustrates areas in which a projection optical system and a substrate are surface-treated.

FIG. 4 shows a magnified view illustrating those disposed in the vicinity of the tip section 7 of the projection optical system PL. As shown in FIG. 4, the surface treatment, which depends on the affinity for the liquid 50, is applied to the tip section 7 of the projection optical system PL. The tip section 7 is a portion to make contact with the liquid 50 when the substrate P is moved in the scanning direction (X axis direction) in order to perform the scanning exposure. The tip section 7 includes a lower surface 7A of the projection optical system PL which includes the lower surface 60A of the optical element 60 and a part of the lower surface of the barrel PK, and a side surface 7B of a part of the barrel PK which is adjacent to the lower surface 7A. In this embodiment, the liquid 50 is water. Therefore, the surface treatment, which is in conformity with the affinity for water, is applied to the tip section 7.

The surface treatment, which is applied to the tip section 7 of the projection optical system PL, is performed in mutually different manners for a first surface area AR1 which includes the surface (lower surface) 60A of the optical element 60 and the part of the lower surface of the barrel PK, and for a second surface area AR2 which is disposed around the first surface area AR1 and which includes the remaining area of the lower surface of the barrel PK and the side surface of the barrel PK. Specifically, the surface treatment is applied to the first and second surface areas AR1, AR2 respectively so that the affinity of the first surface area AR1 for the liquid (water) 50 is higher than the affinity of the second surface area AR2 for the liquid (water) 50. In this embodiment, a lyophilic or liquid-attracting treatment (hydrophilic or water-attracting treatment) to give the lyophilicity or liquid-attracting property is applied to the first surface area AR1 including the optical element 60, and a lyophobic or liquid-repelling treatment (hydrophobic or water-repelling treatment) to give the lyophobicity or liquid-repelling property is applied to the second surface area AR2. The lyophilic or liquid-attracting treatment refers to a treatment to increase the affinity for the liquid. The lyophobic or liquid-repelling treatment refers to a treatment to decrease the affinity for the liquid.

The surface treatment is performed depending on the polarity of the liquid 50. In this embodiment, the liquid 50 is water having large polarity. Therefore, the hydrophilic treatment, which is to be applied to the first surface area AR1 including the optical element 60, is performed by forming a thin film with a substance such as alcohol having a molecular structure of large polarity. Accordingly, the hydrophilicity is given to the first surface area AR1. Alternatively, for example, an $O_2$ plasma treatment, in which the plasma treatment is performed by using oxygen ($O_2$) as a treatment gas, is applied to the barrel PK and the lower surface 60A of the optical element 60 in the first surface area AR1. Accordingly, oxygen molecules (or oxygen atoms), which have strong polarity, are gathered on the surface, and thus it is possible to give the hydrophilicity. As described above, when water is used as the liquid 50, it is desirable to perform the treatment for arranging, on the surface, those having the molecular structure with the large polarity such as the OH group in the first surface area AR1. The first surface area AR1 includes the optical element 60 as a glass member and the barrel PK as a metal member. Therefore, when the hydrophilic treatment is performed, it is possible to perform different surface treatments, for example, such that thin films are formed with different substances for the glass member and the metal member respectively. Of course, the same surface treatment may be applied to the glass member and the metal member in the first surface area AR1 respectively. When the thin film is formed, it is possible to use techniques including, for example, the application and the vapor deposition.

On the other hand, the water-repelling treatment is applied to the second surface area AR2 including the surface of the barrel PK. The water-repelling treatment, which is to be applied to the second surface area AR2, is performed by forming a thin film with a substance having a molecular structure of small polarity including, for example, fluorine. Accordingly, the water-repelling property is given to the second surface area AR2. Alternatively, the water-repelling property can be given by applying a $CF_4$ plasma treatment in which the plasma treatment is performed by using carbon tetrafluoride ($CF_4$) as a treatment gas. It is also possible to use techniques including, for example, the application and the vapor deposition when the thin film is formed in the second surface area AR2.

In this embodiment, the surface treatment is also applied to the surface of the substrate P in conformity with the affinity for the liquid 50. In this case, the hydrophilic or water-attracting treatment is applied to the surface of the substrate P. As for the hydrophilic treatment for the substrate P, the lyophilicity is given to the surface of the substrate P, for example, by forming a thin film with a substance such as alcohol having a molecular structure of large polarity as described above. When the surface of the substrate P is surface-treated by applying alcohol or the like, it is desirable to provide a washing step of washing the applied film in the step after the exposure and before the subsequent application of the photosensitive material, for example, before transporting the substrate to a developer/coater.

When the affinity of the first surface area AR1 for the liquid 50 is higher than the affinity of the second surface area AR2 for the liquid 50, the liquid 50 is stably retained in the first surface area AR1.

In this embodiment, the thin film, which is to be used for the surface treatment, is formed of a material which is insoluble in the liquid 50. The thin film, which is formed on the optical element 60, is to be arranged on the optical path for the exposure light beam EL. Therefore, the thin film is formed of a material through which the exposure light beam EL is transmissive. The film thickness is set to such an extent that the exposure light beam EL is transmissive therethrough as well.

Next, an explanation will be made about the operation for exposing the substrate P with the pattern of the mask M by using the exposure apparatus EX described above.

When the mask M is loaded on the mask stage MST, and the substrate P is loaded on the substrate stage PST, then the control unit CONT drives the liquid supply unit 1 to start the liquid supply operation to the space 56. The liquid supply unit 1 supplies the liquid 50 to the space 56 along with the direction of movement of the substrate P. For example, when the scanning exposure is performed by moving the substrate P in the scanning direction (−X direction) indicated by the arrow Xa (see FIG. 2), the liquid 50 is supplied and recovered with the liquid supply unit 1 and the liquid recovery unit 2 by using the supply tube 3, the supply nozzles 4A to 4C, the recovery tube 4, and the recovery nozzles 5(a), 5(b). That is, when the substrate P is moved in the −X direction, then the liquid 50 is supplied to the space between the projection optical system PL and the substrate P from the liquid supply unit 1 through the supply tube 3 and the supply nozzles 4 (4A to 4C), and the liquid 50 is recovered to the liquid recovery unit 2 through the recovery nozzles 5 (5(a), 5(b)) and the recovery tube 6. The liquid 50 flows in the −X direction so that the space between the lens 60 and the substrate P is filled therewith. On the other hand, when the scanning exposure is performed by moving the substrate P in the scanning direction (+X direction) indicated by an arrow Xb, then the liquid 50 is supplied and recovered with the liquid supply unit 1 and the liquid recovery unit 2 by using the supply tube 10, the supply nozzles 8(a) to 8C, the recovery tube 11, and the recovery nozzles 9A, 9B. That is, when the substrate P is moved in the +X direction, then the liquid 50 is supplied from the liquid supply unit 1 to the space between the projection optical system PL and the substrate P through the supply tube 10 and the supply nozzles 8 (8(a) to 8C), and the liquid 50 is recovered to the liquid recovery unit 2 through the recovery nozzles 9 (9A, 9B) and the recovery tube 11. The liquid 50 flows in the +X direction so that the space between the lens 60 and the substrate P is filled therewith. As described above, the control unit CONT makes the liquid 50 to flow in accordance with the movement direction of the substrate P by using the liquid supply unit 1 and the liquid recovery unit 2. In this arrangement, for example, the liquid 50, which is supplied from the liquid supply unit 1 through the supply nozzles 4, flows so that the liquid 50 is attracted and introduced into the space 56 in accordance with the movement of the substrate P in the −X direction. Therefore, even when the supply energy of the liquid supply unit 1 is small, the liquid 50 can be supplied to the space 56 with ease. When the direction, in which the liquid 50 is made to flow, is switched depending on the scanning direction, then it is possible to fill the space between the substrate P and the tip surface 7 of the lens 60 with the liquid 50, and it is possible to obtain the high resolution and the wide depth of focus, even when the substrate P is scanned in any one of the +X direction and the −X direction.

In view of the above, it is now assumed that the surface treatment is not applied to the projection optical system PL and the substrate P. FIG. 5 schematically shows the flow of the liquid 50 in a state in which the surface treatment is not applied. In this case, it is assumed that the surface of the projection optical system PL and the surface of the substrate P have low affinities for the liquid 50.

Figure 5A:
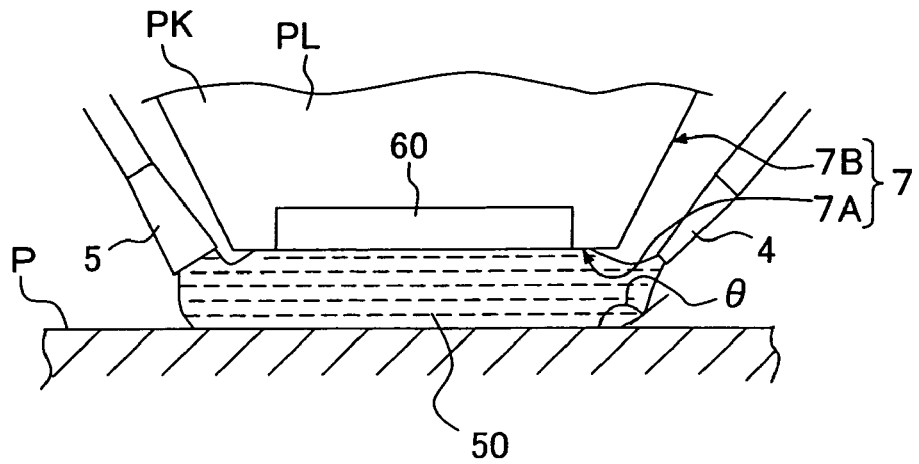
FIGS. 5A to 5C schematically illustrates situations in which the liquid flows between a substrate and a projection optical system which are not surface-treated.
Figure 5B:
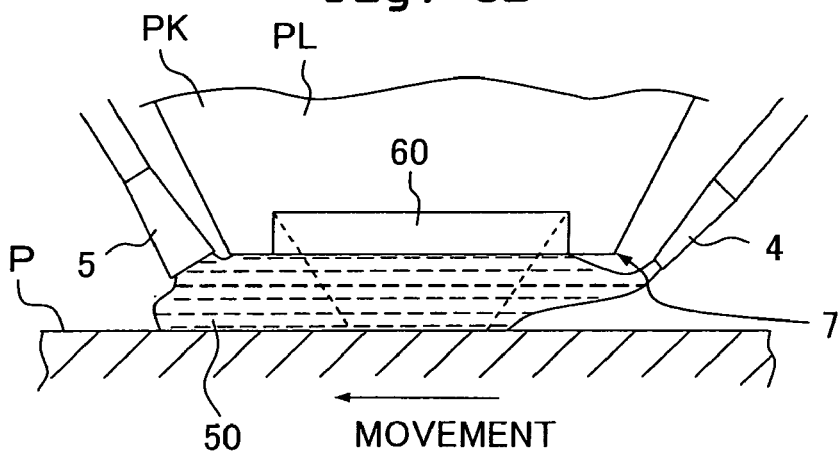
Figure 5C:
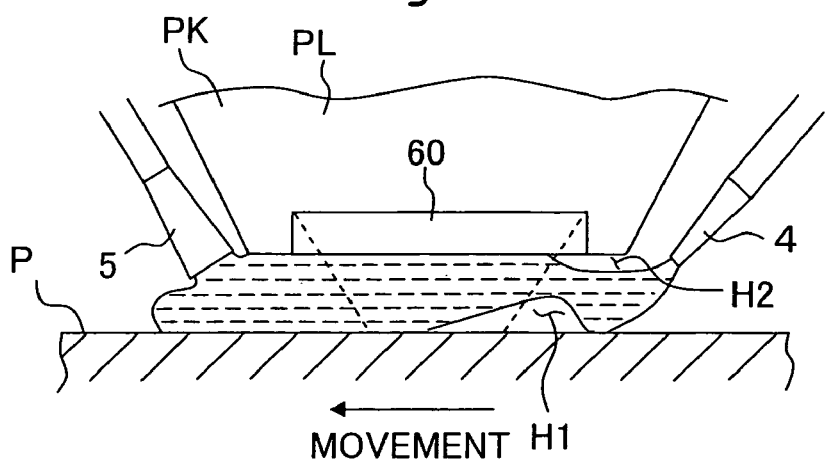

FIG. 5A shows a state in which the substrate stage PST is stopped. The liquid 50 is supplied from the supply nozzles 4, and the liquid 50 is recovered by the recovery nozzles 5. In this situation, the affinity is low between the liquid 50 and the substrate P, and hence the contact angle θ is large. FIG. 5B shows a state in which the substrate P starts the movement in the X axis direction by the aid of the substrate stage PST. The liquid 50 is deformed as if the liquid 50 is pulled by the moving substrate P. The liquid 50 tends to be separated from the surface of the substrate P, because the affinity is low between the liquid 50 and the substrate P. FIG. 5C shows a state in which the movement velocity of the substrate P on the substrate stage PST is further increased. An exfoliation area (bubble) H1 is formed between the substrate P and the liquid 50, and an exfoliation area H2 is also formed between the optical element 60 and the liquid 50. When the exfoliation areas H1, H2 are formed on the optical path for the exposure light beam EL, the pattern of the mask M is not transferred correctly to the substrate P.

FIG. 6 schematically shows the flow of the liquid 50 in a state in which the tip section 7 of the projection optical system PL and the surface of the substrate P are surface-treated as explained with reference to FIG. 4.

Figure 6A:
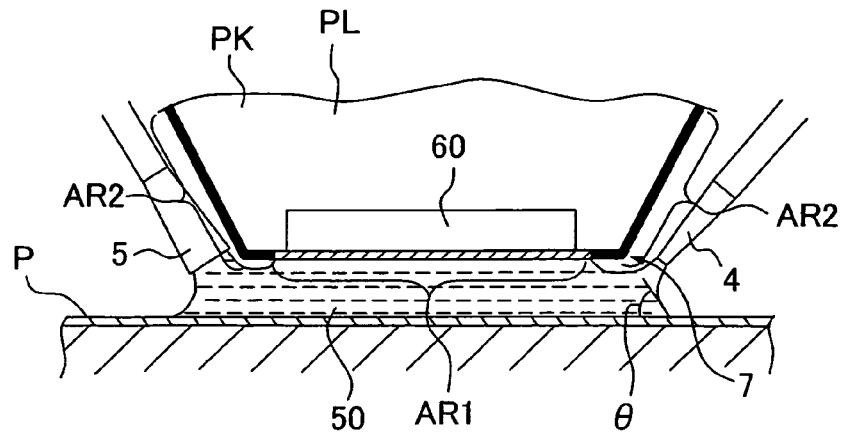
FIGS. 6A to 6C schematically illustrates situations in which the liquid flows between a substrate and a projection optical system which are surface-treated.
Figure 6B:
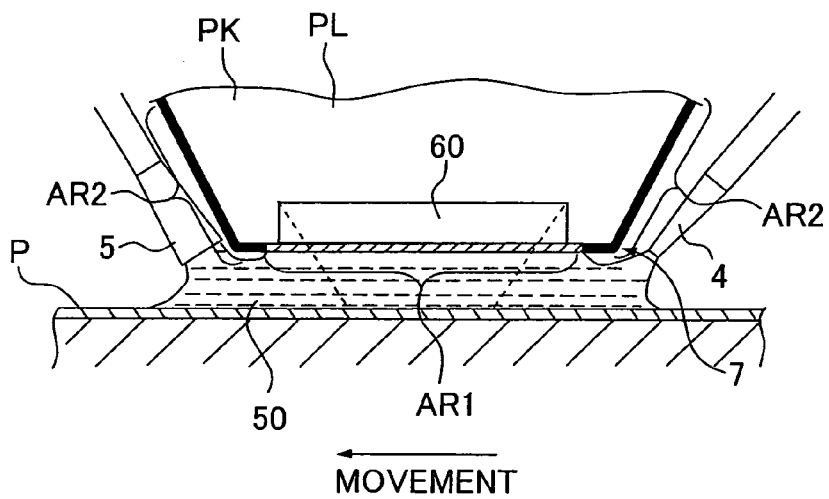
Figure 6C:
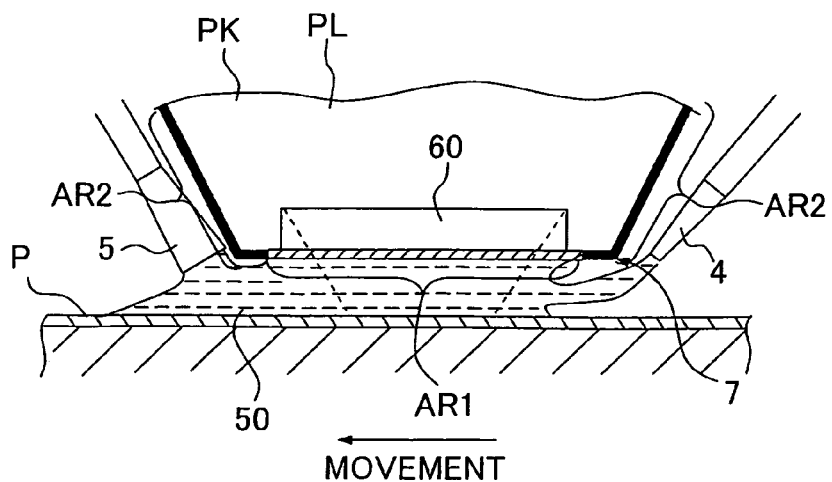

FIG. 6A shows a situation in which the substrate stage PST is stopped. The contact angle θ is small, because the affinity is enhanced between the liquid 50 and the substrate P by applying the surface treatment. FIG. 6B shows a state in which the substrate P starts the movement in the X axis direction by the aid of the substrate stage PST. Even when the substrate P is moved, the liquid 50 is not pulled excessively by the substrate P, because the affinity is high between the liquid 50 and the substrate P. Further, the liquid 50 is not exfoliated from the first surface area AR1, because the affinity of the first surface area AR1 of the projection optical system PL is also high with respect to the liquid 50. In this situation, the circumference of the first surface area AR1 is surrounded by the second surface area AR2 which has the low affinity for the liquid 50. Therefore, the liquid 50 in the space 56 does not outflow to the outside, and the liquid 50 is stably arranged in the space 56. FIG. 6C shows a state in which the movement velocity of the substrate P on the substrate stage PST is further increased. Even when the movement velocity of the substrate P is increased, no exfoliation occurs between the liquid 50 and the projection optical system PL and the substrate P, because the surface treatment is applied to the projection optical system PL and the substrate P.

As explained above, the surface treatment, which is in conformity with the affinity for the liquid 50, is applied to the surface of the substrate P and the tip section 7 of the projection optical system PL as the portions to make contact with the liquid 50 during the exposure process based on the liquid immersion method. Accordingly, it is possible to suppress the occurrence of inconveniences including, for example, the exfoliation of the liquid 50 and the generation of the bubble, and it is possible to stably arrange the liquid 50 between the projection optical system PL and the substrate P. Therefore, it is possible to maintain a satisfactory pattern transfer accuracy.

The surface treatment, which depends on the affinity for the liquid 50, may be applied to only any one of the tip section 7 of the projection optical system PL and the surface of the substrate P.

The foregoing embodiment has been explained such that the surface 60A of the optical element 60 and the part of the lower surface of the barrel (holding member) PK are designated as the first surface area AR1, and the surface treatment is applied to the first surface area AR1 so that the affinity for the liquid 50 is enhanced. That is, the explanation has been made assuming that the boundary between the lyophilic or liquid-attracting treatment area and the lyophobic or liquid-repelling treatment area exists on the lower surface of the barrel PK. However, the boundary may be set on the surface of the optical element 60. That is, it is also allowable that the liquid-attracting treatment is applied to a part of the area of the optical element 60 (at least an area through which the exposure light beam passes), and the liquid-repelling treatment is applied to the remaining area. Of course, it is also allowable that the boundary between the liquid-attracting treatment area and the liquid-repelling treatment area may be coincident with the boundary between the optical element 60 and the barrel PK. That is, it is also allowable that the liquid-attracting treatment is applied to only the optical element 60.

Further, there is no limitation to the setting of the boundary on the lower surface 7A of the projection optical system PL. All of the lower surface 7A of the projection optical system PL may be subjected to the liquid-attracting treatment.

Further, when the surface treatment is performed, it is also possible to allow the lyophilicity (lyophobicity) to have a distribution. In other words, the surface treatment can be performed such that the contact angle of the liquid has mutually different values for a plurality of areas on the surface subjected to the surface treatment. Alternatively, lyophilic areas and lyophobic areas may be appropriately arranged in a divided manner.

The thin film, which is to be used for the surface treatment, may be a single layer film or a film composed of a plurality of layers. As for the material for forming the film, it is possible to use arbitrary materials provided that the material exhibits desired performance, including, for example, metals, metal compounds, and organic matters.

For example, the thin film formation and the plasma treatment are effective for the surface treatment for the optical element 60 and the substrate P. However, in relation to the surface treatment for the barrel PK as the metal member, it is possible to adjust the affinity for the liquid by any physical technique including, for example, the rough surface treatment for the surface of the barrel PK.

In the embodiment described above, the surface of the substrate P is made lyophilic (subjected to the liquid-attracting treatment) while giving much weight to the stable retention of the liquid between the projection optical system PL and the substrate P. However, when much weight is given to the recovery and the removal of the liquid from the surface of the substrate P, the surface of the substrate P may be made lyophobic (subjected to the liquid-repelling treatment).

In the embodiment described above, the surface treatment, which is in conformity with the affinity for the liquid 50, is applied to the tip section 7 of the projection optical system PL and the surface of the substrate P. However, it is also allowable that any liquid, which is in conformity with the affinity for at least one of the tip section 7 of the projection optical system PL and the surface of the substrate P, is supplied from the liquid supply unit 1.

As described above, pure water is used as the liquid 50 in this embodiment. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the tip surface of the projection optical system PL.

It is approved that the refractive index n of pure water (water) with respect to the exposure light beam EL having a wavelength of about 193 nm is approximately in an extent of 1.44 to 1.47. When the ArF excimer laser beam (wavelength: 193 nm) is used as the light source of the exposure light beam EL, then the wavelength is shortened on the substrate P by 1/n, i.e., to about 131 to 134 nm, and a high resolution is obtained. Further, the depth of focus is magnified about n times, i.e., about 1.44 to 1.47 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the plane parallel plate is attached as the optical element 60 to the tip of the projection optical system PL. However, the optical element, which is attached to the tip of the projection optical system PL, may be an optical plate which is usable to adjust the optical characteristics of the projection optical system PL, for example, the aberration (for example, spherical aberration and comatic aberration), or the optical element may be a lens. On the other hand, when the optical element, which makes contact with the liquid 50, is the plane parallel plate which is cheaper than the lens, it is enough that the plane parallel plate is merely exchanged immediately before supplying the liquid 50 even when any substance (for example, any silicon-based organic matter), which deteriorates the transmittance of the projection optical system PL, the illuminance of the exposure light beam EL on the substrate P, and the uniformity of the illuminance distribution, is adhered to the plane parallel plate, for example, during the transport, the assembling, and/or the adjustment of the exposure apparatus EX. An advantage is obtained such that the exchange cost is lowered as compared with the case in which the optical element to make contact with the liquid 50 is the lens. That is, the surface of the optical element to make contact with the liquid 50 is dirtied, for example, due to the adhesion of scattered particles generated from the resist by being irradiated with the exposure light beam EL or any impurity contained in the liquid 50. Therefore, it is necessary to periodically exchange the optical element. However, when the optical element is the cheap plane parallel plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 50, is large between the substrate P and the optical element disposed at the tip of the projection optical system PL, it is also allowable that the optical element is tightly fixed so that the optical element is not moved by the pressure, rather than allowing the optical element to be exchangeable.

The liquid 50 is water in the embodiment described above. However, the liquid 50 may be any liquid other than water. For example, when the light source of the exposure light beam EL is the $F_2$ laser, the $F_2$ laser beam is not transmitted through water. Therefore, in this case, those preferably usable as the liquid 50 may include, for example, fluorine-based oil (fluorine-based liquid) and perfluoropolyether (PFPE) through which the $F_2$ laser beam is transmissive. In this case, the surface of the substrate P and the portion of the projection optical system PL to make contact with the liquid 50 are subjected to the liquid-attracting treatment by forming the thin film, for example, with a substance having a molecular structure of small polarity including fluorine. Alternatively, other than the above, it is also possible to use, as the liquid 50, those (for example, cedar oil) which have the transmittance with respect to the exposure light beam EL, which have the refractive index as high as possible, and which are stable against the photoresist applied to the surface of the substrate P and the projection optical system PL. Also in this case, the surface treatment is performed depending on the polarity of the liquid 50 to be used.

Figure 7:
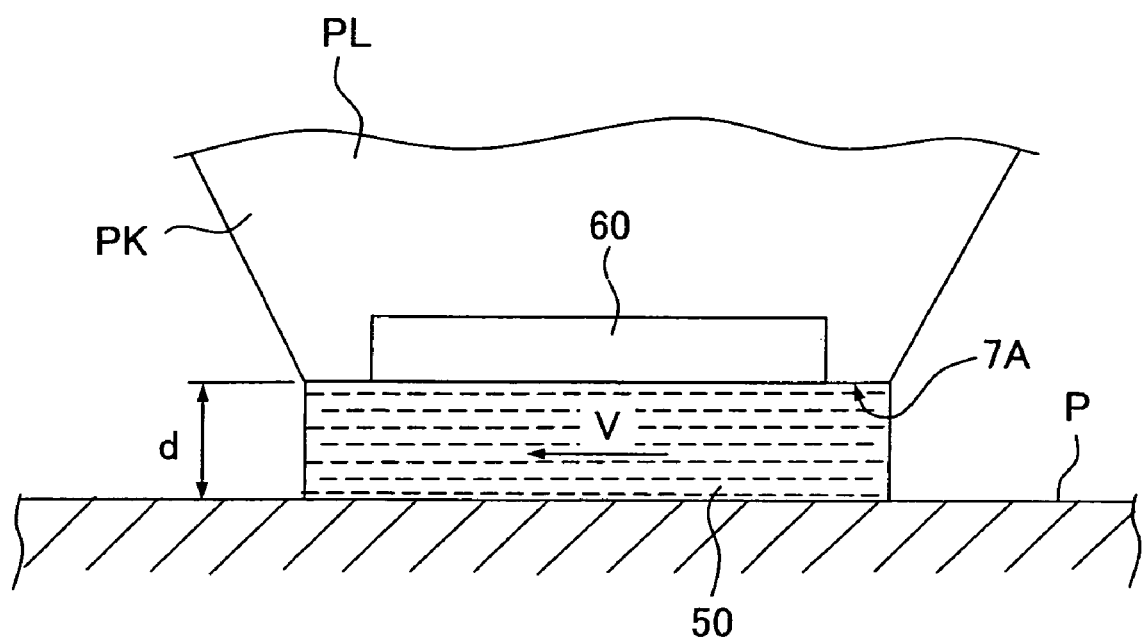
FIG. 7 illustrates another embodiment of the present invention.

Next, an explanation will be made with reference to FIG. 7 about a second embodiment of the present invention.

An exposure apparatus EX of this embodiment is designed such that the following conditional expression is satisfied provided that d represents a thickness of the liquid 50 between the lower surface 7A of the projection optical system PL and the surface of the substrate P (in this case, the spacing distance between the projection optical system PL and the substrate P), v represents a velocity of a flow of the liquid 50 between the projection optical system PL and the substrate P, ρ represents a density of the liquid 50, and μ represents a coefficient of viscosity of the liquid 50:

$$(v \cdot d \cdot \rho)/\mu \leq 2{,}000 \tag{3}$$

Accordingly, the liquid 50 flows as a laminar flow in the space 56. As for the liquid 50, it is also assumed that a plurality of different flow velocities v exist depending on the position in the liquid. However, it is enough that the maximum velocity $V_{max}$ thereof satisfies the expression (3).

The control unit CONT adjusts at least one of the amount of supply of the liquid per unit time to the space 56 by the aid of the liquid supply unit 1 and the amount of recovery of the liquid per unit time from the space 56 by the aid of the liquid recovery unit 2 so that the conditional expression (3) is satisfied. Accordingly, the velocity v of the liquid 50 to flow through the space 56 is determined, and it is possible to satisfy the conditional expression (3). When the conditional expression (3) is satisfied, the liquid 50 flows through the space 56 while forming the laminar flow.

Alternatively, the control unit CONT can also satisfy the conditional expression (3) by adjusting the movement velocity in the scanning direction of the substrate P by the substrate stage PST. That is, the velocity v of the liquid 50 flowing through the space 56 is also determined by the movement velocity of the substrate P in some cases. That is, there is such a possibility that the liquid 50 on the substrate P may flow such that the liquid 50 is pulled by the substrate P in accordance with the movement of the substrate P. In this case, the conditional expression (3) can be satisfied by adjusting the movement velocity of the substrate P. For example, when the substrate P and the liquid 50 flow or move at approximately identical velocities with respect to the projection optical system PL, it is appropriate that the movement velocity of the substrate P may be regarded as the velocity v of the liquid 50 to satisfy the conditional expression (3). Also in this case, the liquid 50 flows through the space 56 while forming the laminar flow. Further, in this case, it is not necessarily indispensable to operate the liquid supply unit 1 and the liquid recovery unit 2 during the exposure for the substrate P. The flow of the liquid 50 can be made to be the laminar flow by adjusting only the movement velocity of the substrate P.

In order to satisfy the conditional expression (3), the thickness d of the liquid 50 (i.e., the spacing distance between the projection optical system PL and the substrate P) may be previously set as a designed value for the exposure apparatus, and the velocity v may be determined on the basis of this value. Alternatively, the velocity v may be previously set as a designed value, and the thickness (distance) d may be determined on the basis of this value.

Figure 8A:
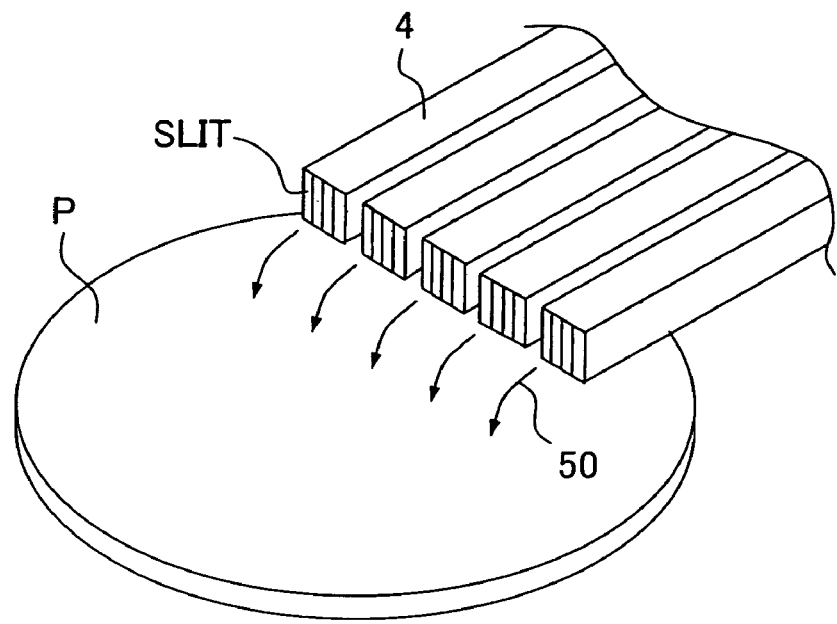
FIGS. 8A and 8B show other embodiments of supply nozzles.
Figure 8B:
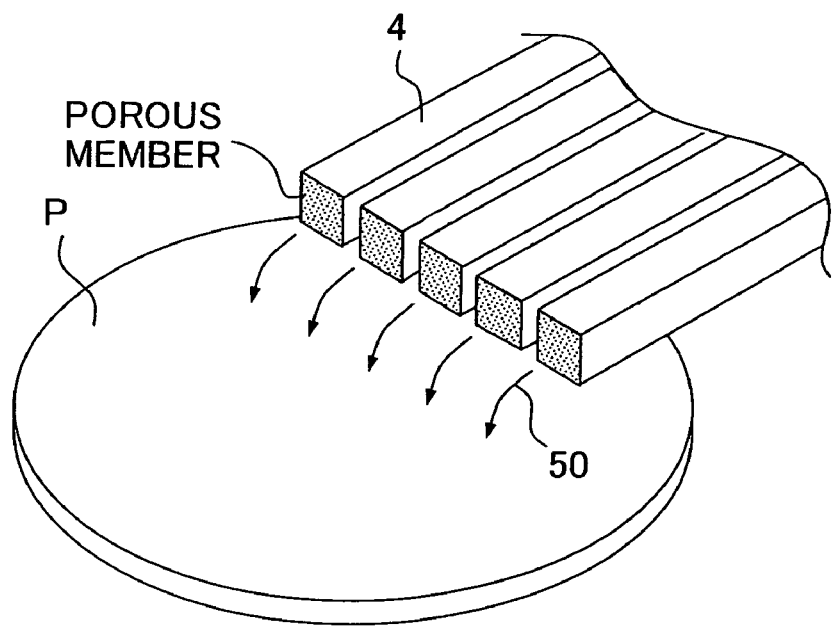

In order that the liquid 50 flows while forming the laminar flow in the space 56, for example, slits may be provided at openings of the supply nozzles 4 connected to the liquid supply unit 1 as shown in FIG. 8A, or porous members are provided at openings of the supply nozzles 4 as shown in FIG. 8B. Accordingly, the liquid 50 can be rectified to flow in the laminar flow state.

When the liquid 50 flows as the laminar flow, it is possible to suppress inconveniences such as the vibration and the change in the refractive index which would be otherwise caused by the fluctuation of the pressure. Thus, it is possible to maintain a satisfactory pattern transfer accuracy. Further, when the surface treatment is applied to the surface of the substrate P and the portion of the projection optical system PL to make contact with the liquid 50, and the exposure apparatus EX is set so that the conditional expression (3) is satisfied to perform the exposure process, then the liquid 50 in the space 56 is established to be in a more satisfactory state in which no influence is exerted on the pattern transfer accuracy.

In the embodiment described above, the exposure apparatus is adopted, in which the space between the projection optical system PL and the substrate P is locally filled with the liquid. However, the present invention is also applicable to a liquid immersion exposure apparatus in which a stage holding a substrate as an exposure objective is moved in a liquid bath, and a liquid immersion exposure apparatus in which a liquid pool having a predetermined depth is formed on a stage and a substrate is held therein. The structure and the exposure operation of the liquid immersion exposure apparatus in which the stage holding the substrate as the exposure objective is moved in the liquid bath are disclosed, for example, in Japanese Patent Application Laid-open No. 6-124873, content of which is incorporated herein by reference within a range of permission of the domestic laws and ordinances of the state designated or selected in this international application. The structure and the exposure operation of the liquid immersion exposure apparatus in which the liquid pool having the predetermined depth is formed on the stage and the substrate is held therein are disclosed, for example, in Japanese Patent Application Laid-open No. 10-303114 and U.S. Pat. No. 5,825,043, contents of which are incorporated herein by reference within a range of permission of the domestic laws and ordinances of the state designated or selected in this international application.

In the embodiment described above, the liquid supply unit 1 and the liquid recovery unit 2 are used to continue the supply and the recovery of the liquid 50 during the exposure for the substrate P as well. However, it is also allowable to stop the supply and the recovery of the liquid 50 by the liquid supply unit 1 and the liquid recovery unit 2 during the exposure for the substrate P. That is, a small amount of the liquid 50 is supplied by the liquid supply unit 1 onto the substrate P to such an extent that the liquid immersion portion, which has a thickness of not more than the working distance of the projection optical system PL (about 0.5 to 1.0 mm), is formed between the substrate P and the tip section 7 of the projection optical system PL, or to such an extent that a thin liquid film is formed on the entire surface of the substrate P before the start of the exposure for the substrate P. The tip section 7 of the projection optical system PL and the substrate P are made to tightly contact with each other by the aid of the liquid 50. The spacing distance between the tip section 7 of the projection optical system PL and the substrate P is not more than several mm. Therefore, even when the substrate P is moved without supplying and recovering the liquid by using the liquid supply unit 1 and the liquid recovery unit 2 during the exposure for the substrate P, it is possible to continuously retain the liquid 50 between the projection optical system PL and the substrate P owing to the surface tension of the liquid 50. The resist (photosensitive film), which is disposed on the substrate P, is not damaged by the supply of the liquid from the liquid supply unit 1 as well. In this case, when a coating for repelling the liquid 50 (water-repelling coating when the liquid is water) is applied with a predetermined width to the circumferential edge of the substrate P, it is possible to avoid the outflow of the liquid 50 from the substrate P. It goes without saying that the conditional expression (3) is satisfied to generate no turbulence in the liquid 50 when the substrate P is moved.

In the embodiment described above, the liquid (50) is supplied on the substrate stage PST. However, the liquid may be supplied onto the substrate P before the substrate P is imported onto the substrate stage PST. In this case, when the liquid, which is supplied to a part or all of the surface of the substrate P, has a thickness of about 0.5 to 1.0 mm, then the substrate P can be imported to the substrate stage PST and the substrate P can be exported from the substrate stage PST while placing the liquid on the substrate P by the surface tension. Also in this case, when a liquid-repelling coating having a predetermined width is applied to the circumferential edge of the substrate P, it is possible to enhance the retaining force for the liquid on the substrate P. When the substrate P is imported to the substrate stage PST and the substrate P is exported from the substrate stage PST while retaining the liquid on the substrate P as described above, it is possible to omit the mechanism for supplying and recovering the liquid on the substrate stage PST.

Figure 9:
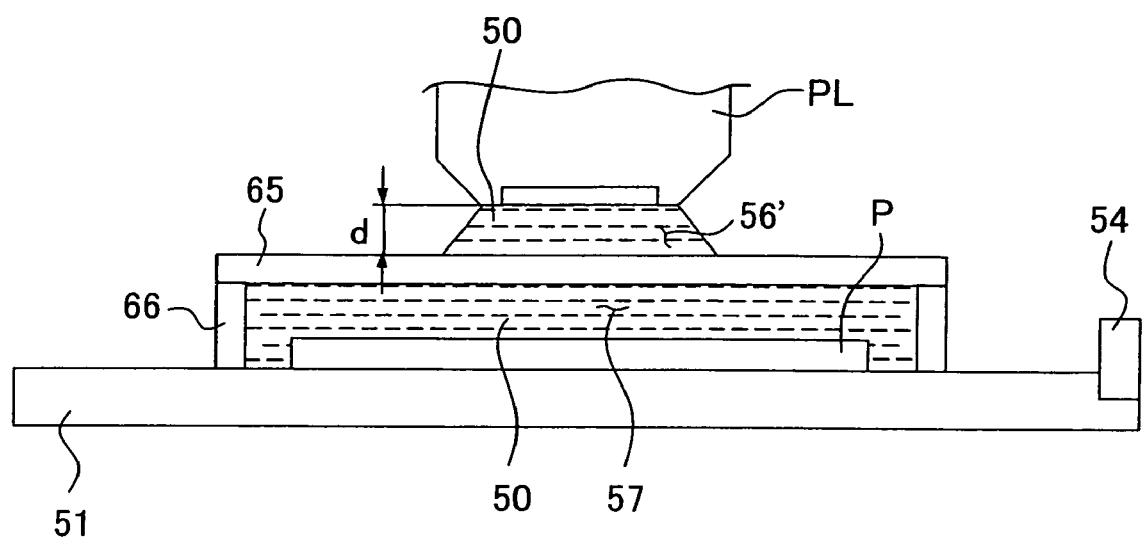
FIG. 9 shows a cover glass provided over a substrate.

The embodiment described above is constructed such that the space between the projection optical system PL and the surface of the substrate P is filled with the liquid 50. However, for example, as shown in FIG. 9, the space may be filled with the liquid 50 in a state in which a cover glass 65, which is composed of a plane parallel plate, is attached to the surface of the substrate P. In this arrangement, the cover glass 65 is supported over the Z stage 51 by the aid of a support member 66. The space 57, which is formed by the cover glass 65, the support member 66, and the Z stage 51, is a substantially tightly closed or sealed space. The liquid 50 and the substrate P are arranged in the space 57. The cover glass 65 is composed of a material through which the exposure light beam EL is transmissive. The liquid 50 is supplied to and recovered from a space 56' between the surface of the cover glass 65 and the projection optical system PL by using the liquid supply unit 1 and the liquid recovery unit 2. The setting is made such that the conditional expression (3) described above is satisfied in the space 56' provided that d represents the spacing distance between the surface of the cover glass 65 and the tip section 7 of the projection optical system PL.

The surface treatment, which is in conformity with the affinity for the liquid 50, can be also applied to the surface (upper surface) of the cover glass 65. It is desirable that the liquid-attracting treatment is applied to the surface of the cover glass 65. Therefore, when the liquid 50 is water, a thin film is formed with a substance having a molecular structure of large polarity on the surface of the cover glass 65.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are made to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

As for the type of the exposure apparatus EX, the present invention is not limited to the exposure apparatus for the semiconductor production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 10:
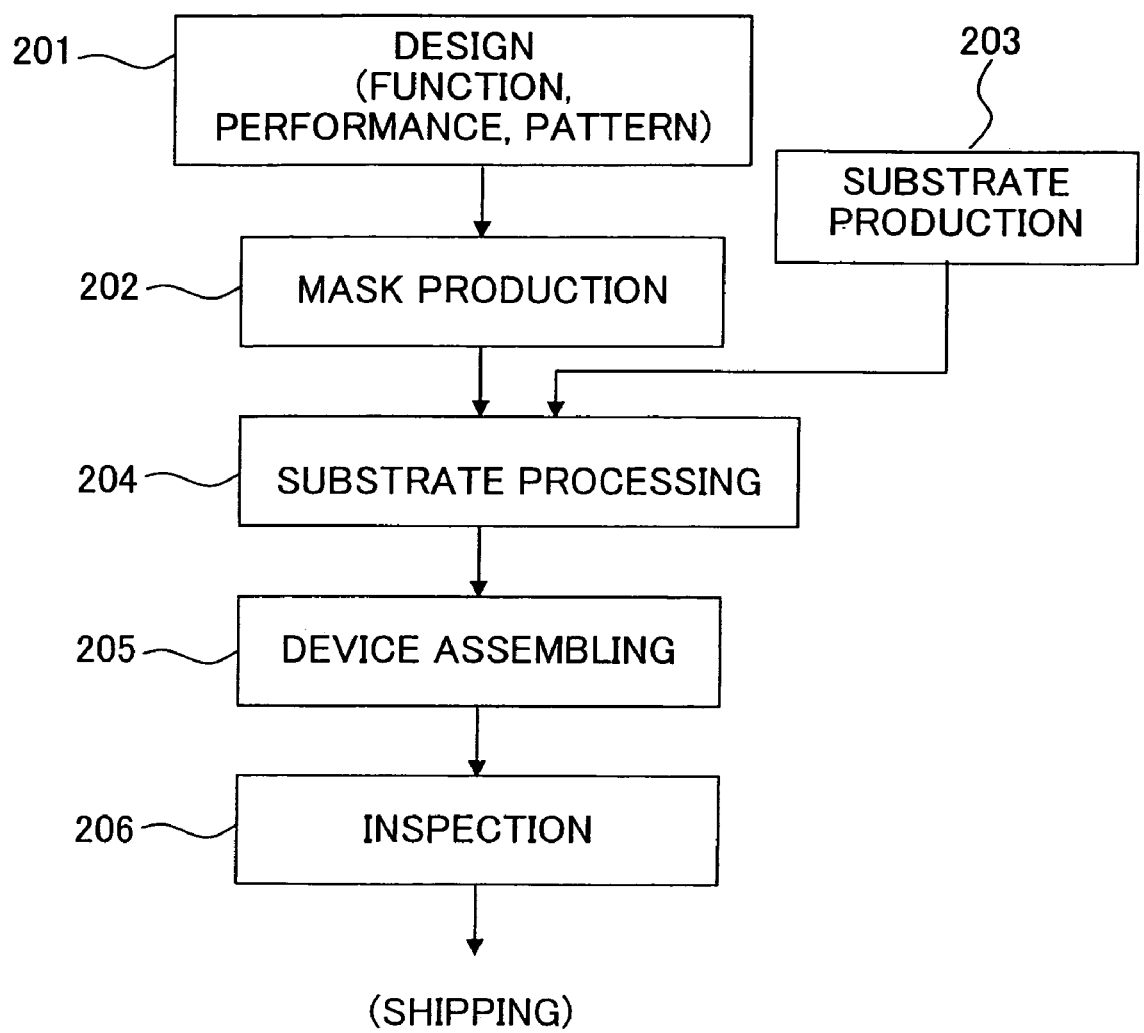
FIG. 10 shows a flow chart illustrating exemplary steps for producing a semiconductor device.

As shown in FIG. 10, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206. The exposure process step 204 includes a step of performing the surface treatment for the substrate in order to adjust the hydrophilicity for the substrate and the liquid before the exposure.

According to the present invention, it is possible to suppress the exfoliation of the liquid, the generation of the bubble, or the occurrence of the turbulence, and it is possible to maintain the liquid in a desired state between the projection optical system and the substrate in the liquid immersion exposure. Accordingly, the pattern can be transferred correctly with a wide depth of focus. Therefore, the present invention is extremely useful for the exposure based on the use of the short wavelength light source such as ArF. It is possible to produce a highly integrated device having desired performance.

What is claimed is:

1. An exposure apparatus comprising:
   a projection optical system which projects a pattern onto a substrate, wherein the substrate is exposed through a liquid medium kept at least in a portion between the substrate and an optical element of the projection optical system which optical element is nearest to the substrate;
   a supplying system having an opening from which a liquid medium is supplied through a porous material;
   a substrate holder which holds the substrate and which is movable relative to the optical element and the opening; and
   a collecting system which collects a liquid medium.

2. A device manufacturing method, comprising:
   exposing a substrate by use of an exposure apparatus as recited in claim 1; and
   processing the exposed substrate.

3. An exposure method, comprising:
   supplying a liquid medium from an opening through a porous material;
   moving a substrate relative to the opening; and
   exposing the substrate with an exposure beam through the liquid medium supplied from the opening through the porous material.

4. An exposure method according to claim 3, wherein the substrate is moved in a scanning direction during the exposure, and the liquid medium flows in a space between the substrate and an optical member during the exposure.

5. A liquid immersion exposure apparatus comprising:
   an optical member through which an exposure beam passes;
   a flow passage in which a liquid flows, the flow passage being in fluidic communication with a space between the optical member and an object opposite to the optical member;
   a porous material disposed in the flow passage;
   an opening through which the flow passage is in fluidic communication with the space, and from which the liquid is supplied to the space; and
   a holder which holds the object and which is movable relative to the optical member and the opening.

6. An apparatus according to claim 5, wherein the object is a substrate having a resist coating.

7. An apparatus according to claim 5, wherein the porous material is disposed in the vicinity of the opening.

8. An apparatus according to claim 7, wherein the space is filled with the liquid supplied from the opening through the porous material.

9. An apparatus according to claim 5, wherein the space is filled with the liquid supplied from the opening through the porous material.

10. An apparatus according to claim 9, wherein the object is a substrate having a resist coating to which the exposure beam is irradiated through the optical member and the liquid in the space.

11. An apparatus according to claim 9, wherein the liquid is supplied from above the substrate through the porous material.

12. An apparatus according to claim 11, wherein the liquid is supplied so as to form a liquid immersion area on a portion of the substrate during the exposure.

13. A device manufacturing method, comprising:
    exposing a substrate by use of an exposure apparatus as recited in claim 5; and
    processing the exposed substrate.

14. A device manufacturing method comprising:
    supplying a liquid medium from an ooening through a porous member;
    moving a substrate relative to the opening; and
    exposing the substrate with a patterned beam through the liquid medium supplied from the opening through the porous member.

15. A method according to claim 14, wherein the substrate has a resist coating.

16. A method according to claim 14, wherein the substrate has a coating which is determined based on characteristics of the liquid medium.

17. A method according to claim 16, wherein the coating of the substrate is repellent against the liquid medium.

18. A method according to claim 17, wherein the coating is applied at a peripheral portion of the substrate.

19. A method according to claim 14, wherein the liquid medium is supplied from above the substrate.

20. A method according to claim 19, wherein the patterned beam is projected onto the substrate through a projection system and the liquid medium, and wherein a liquid immersion area is formed on a portion of the substrate so as to fill a space between the projection system and the substrate with the liquid medium.

* * * * *